(12) United States Patent
Horiuchi et al.

(10) Patent No.: US 11,367,622 B2
(45) Date of Patent: *Jun. 21, 2022

(54) MANUFACTURING METHOD OF SEMICONDUCTOR DEVICE AND ETCHING GAS

(71) Applicant: Kioxia Corporation, Tokyo (JP)

(72) Inventors: Mitsunari Horiuchi, Yokkaichi Mie (JP); Toshiyuki Sasaki, Yokkaichi Mie (JE); Tomo Hasegawa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/022,640

(22) Filed: Sep. 16, 2020

(65) Prior Publication Data

US 2021/0005463 A1 Jan. 7, 2021

Related U.S. Application Data

(63) Continuation of application No. 16/286,241, filed on Feb. 26, 2019, now Pat. No. 10,804,113.

(30) Foreign Application Priority Data

Aug. 9, 2018 (JP) .............................. JP2018-150773

(51) Int. Cl.
*H01L 21/311* (2006.01)
*H01L 21/3213* (2006.01)
*H01L 21/3065* (2006.01)

(52) U.S. Cl.
CPC .... *H01L 21/31116* (2013.01); *H01L 21/3065* (2013.01); *H01L 21/32137* (2013.01); *H01L 21/31138* (2013.01)

(58) Field of Classification Search
CPC .......... H01L 21/3065; H01L 21/31116; H01L 21/31138; H01L 21/32137
(Continued)

(56) References Cited

U.S. PATENT DOCUMENTS 6,939,806 B2 9/2005 Jiwari
7,919,141 B2 4/2011 Tanioka et al.
(Continued)

FOREIGN PATENT DOCUMENTS

JP 2003-133289 A 5/2003
JP 2011-044740 A 3/2011
(Continued)

*Primary Examiner* — Lan Vinh
(74) *Attorney, Agent, or Firm* — Foley & Lardner LLP (57) ABSTRACT

A manufacturing method of a semiconductor device includes etching a film using etching gas that has a first or second molecule which has a $C_3F_4$ group and in which the number of carbon atoms is four or five. Further, the first molecule has an R1 group that bonds to a carbon atom in the $C_3F_4$ group through a double bond, and the R1 group contains carbon and also chlorine, bromine, iodine, or oxygen. Further, the second molecule has an R2 group that bonds to a carbon atom in the $C_3F_4$ group through a single bond and an R3 group that bonds to the carbon atom in the $C_3F_4$ group through a single bond, the R2 group or the R3 group or both containing carbon, and both the R2 group and the R3 group containing hydrogen, fluorine, chlorine, bromine, iodine, or oxygen.

20 Claims, 8 Drawing Sheets

(58) Field of Classification Search
USPC ..... 438/706, 714, 719; 252/79.1, 79.2, 79.3, 252/79.4
See application file for complete search history.

(56) References Cited

U.S. PATENT DOCUMENTS

| | | | |
|---|---|---|---|
| 10,804,113 B2* | 10/2020 | Horiuchi | H01L 21/32137 |
| 2002/0182876 A1* | 12/2002 | Kawai | H01J 37/32477 |
| | | | 438/706 |
| 2005/0103441 A1* | 5/2005 | Honda | H01L 21/31116 |
| | | | 156/345.47 |
| 2005/0161640 A1 | 7/2005 | Kwean et al. | |
| 2011/0059617 A1* | 3/2011 | Mitchell | H01J 37/32357 |
| | | | 438/723 |
| 2015/0294880 A1 | 10/2015 | Anderson et al. | |

FOREIGN PATENT DOCUMENTS

| | | | |
|---|---|---|---|
| JP | 4804345 B2 | 11/2011 | |
| JP | 6323540 B1 | 5/2018 | |

* cited by examiner

| | | C | | | | |
|---|---|---|---|---|---|---|
| | | 4 | 3 | 2 | 1 | 0 |
| F | 6 | $C_4F_6$ | $C_3F_6$ | $C_2F_6$ | | |
| | 5 | $C_4F_5$ | $C_3F_5$ | $C_2F_5$ | | |
| | 4 | $C_4F_4$ | $C_3F_4$ | $C_2F_4$ | $CF_4$ | |
| | 3 | $C_4F_3$ | $C_3F_3$ | $C_2F_3$ | $CF_3$ | |
| | 2 | $C_4F_2$ | $C_3F_2$ | $C_2F_2$ | $CF_2$ | $F_2$ |
| | 1 | $C_4F$ | $C_3F$ | $C_2F$ | $CF$ | $F$ |
| | 0 | $C_4$ | $C_3$ | $C_2$ | $C$ | |

MANUFACTURING METHOD OF SEMICONDUCTOR DEVICE AND ETCHING GAS

CROSS-REFERENCE TO RELATED APPLICATION

This application is a Continuation of U.S. application Ser. No. 16/286,241, filed Feb. 26, 2019, which is based upon and claims the benefits and priority from Japanese Patent Application No. 2018-150773, filed on Aug. 9, 2018, the entire contents of which are incorporated herein by reference.

FIELD

Embodiments described herein relate generally to a manufacturing method of a semiconductor device and etching gas.

BACKGROUND

When a recess portion is formed on a film by etching using carbon and fluorine-containing gas, such as $C_4F_6$ gas, a fluorocarbon film is deposited on a side surface of the film in the recess portion, and the side surface of the film is protected using the fluorocarbon film during the etching. Although the $C_4F_6$ gas has an advantage such as a high rate of deposition of the fluorocarbon film, the $C_4F_6$ gas has a disadvantage such as an expensive unit price. Thus, suitable carbon and fluorine-containing gas that serves as an alternative gas to the $C_4F_6$ gas has been required.

Examples of related art include Japanese Patent Nos. 6323540 and 4804345, JP-A-2011-44740, and JP-A-2003-133289.

DETAILED DESCRIPTION

Embodiments herein provide a manufacturing method of a semiconductor device and etching gas capable of etching a film with suitable carbon and fluorine-containing gas.

In general, according to one embodiment, a method of manufacturing a semiconductor device includes etching a film using etching gas that has a first or second molecule, which has a $C_3F_4$ group (C represents carbon, and F represents fluorine), and in which the number of carbon atoms is four or five. Further, the first molecule has an R1 group that bonds to one of the carbon atoms in the $C_3F_4$ group through a double bond, the R1 group containing carbon and also chlorine, bromine, iodine, or oxygen. Further, the second molecule has an R2 group that bonds to a carbon atom in the $C_3F_4$ group through a single bond and an R3 group that bonds to the carbon atom in the $C_3F_4$ group through a single bond, the R2 group or the R3 group or both containing carbon, and both the R2 group and the R3 group containing hydrogen, fluorine, chlorine, bromine, iodine, or oxygen.

Hereinafter, embodiments will be described with reference to drawings. The same reference numerals will be applied to the same or similar structures in FIGS. 1 to 10, and repeated description will be omitted.

First Embodiment

Figure 1A:
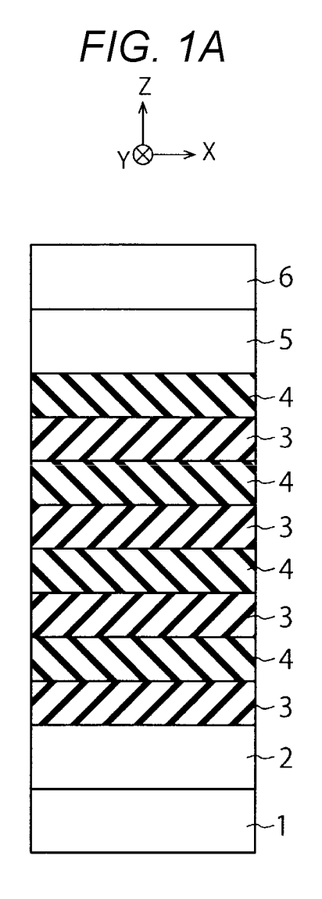
FIGS. 1A to 1C are sectional views illustrating a manufacturing method of a semiconductor device according to a first embodiment.
Figure 1B:
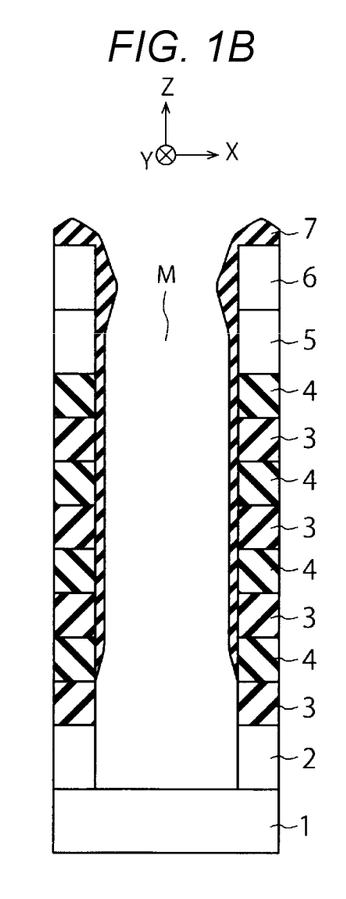
Figure 1C:
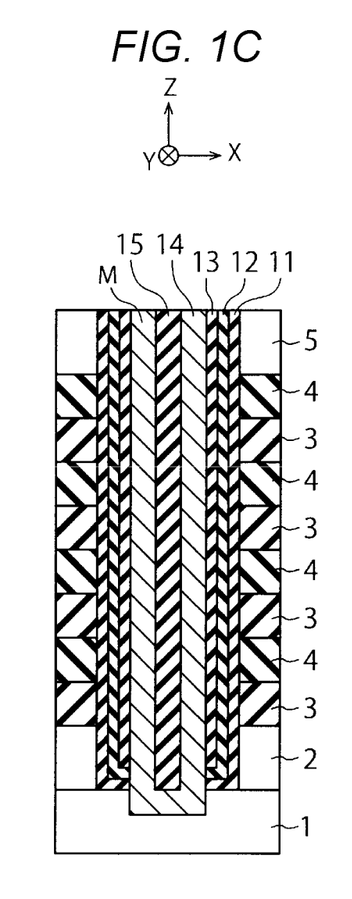

FIG. 1 is a sectional view illustrating a manufacturing method of a semiconductor device according to a first embodiment. The semiconductor device according to the embodiment is a three-dimensional memory.

First, a lower layer 2 is formed on a substrate 1, and a stacked film alternately including a plurality of sacrifice layers 3 and a plurality of insulating layers 4 is formed on the lower layer 2 (FIG. 1A). The sacrifice layers 3 are an example of the first film while the insulating layers 4 are an example of the second film. Next, an upper layer 5 is formed on the stacked film, and a mask layer 6 is formed on the upper layer 5 (FIG. 1(a)).

The substrate 1 is a semiconductor substrate such as a silicon (Si) substrate. FIG. 1A illustrates an X direction and a Y direction that are parallel to a surface of the substrate 1 and are perpendicular to one another and a Z direction that is perpendicular to the surface of the substrate 1. In the specification, the +Z direction is handled as an upper direction while the −Z direction is handled as a lower direction. The −Z direction may or may not conform to the gravity direction.

The lower layer 2 is an insulating film such as a silicon oxide film ($SiO_2$) or a silicon nitride film (SiN) or a conductive layer that is formed between insulating films. The sacrifice layers 3 are silicon nitride films, for example, and the insulating layers 4 are silicon oxide films, for example. The upper layer 5 is an insulating film such as a silicon oxide film or a silicon nitride film, for example, or a conductive layer that is formed between insulating films. A mask layer 6 is a hard mask layer such as an organic film, a metal film, or a silicon-containing film, for example. Examples of the silicon-containing film include a silicon oxide film, a silicon nitride film, and a polysilicon film.

Next, an opening pattern for forming a memory hole M is formed on the mask layer 6 through lithography and dry etching (FIG. 1B). Next, the memory hole M that penetrates through the upper layer 5, the plurality of insulating layers 4, the plurality of sacrifice layers 3, and the lower layer 2 is formed through dry etching using the mask layer 6 (FIG. 1B). An aspect ratio of the memory hole M is equal to or greater than 10, for example. The memory hole M is an example of a recess portion.

The memory hole M according to the embodiment is formed through dry etching using etching gas that contains carbon and fluorine-containing gas. As a result, a protective film 7 is deposited on side surfaces of the insulating layers 4 and the sacrifice layers 3 in the memory hole M during the dry etching, and the side surfaces of the insulating layers 4 and the sacrifice layers 3 are protected with the protective film 7. The protective film 7 according to the embodiment is a $C_mF_n$ film (fluorocarbon film). Here, C represents carbon, F represents fluorine, and m and n represent integers that are equal to or greater than one.

The etching gas according to the embodiment contains a first molecule or a second molecule as the molecule of carbon and fluorine-containing gas. Both the first molecule and the second molecule have $C_3F_4$ groups (CF—CF=$CF_2$ groups) where the symbol "—" represents a single bond and the symbol "=" represents a double bond. The number of carbon atoms in the first molecule is four or five. Similarly, the number of carbon atoms in the second molecule is four or five.

The first molecule further has an R1 group that bonds to one of the carbon atoms in the $C_3F_4$ group through a double bond. The R1 group contains carbon and also contains chlorine (Cl), bromine (Br), iodine (I), or oxygen (O). The R1 group is a $CCl_2$ group or a CO group, for example. The R1 group may further contain hydrogen (H) or fluorine (F).

The second molecule further has an R2 group that bonds to one of the carbon atoms in the $C_3F_4$ group through a single bond and an R3 group that bonds to the one of the carbon atoms in the $C_3F_4$ group through a single bond. The R2 group or the R3 group or both contains carbon, and both the R2 group and the R3 group contain hydrogen, fluorine, chlorine, bromine, iodine, or oxygen. One combination of the R2 group and the R3 group is a $CH_3$ group and an F group, for example.

The $C_3F_4$ group is a functioning group that is also contained in a $C_4F_6$ molecule. As a result, it has been determined that the rate of deposition of the protective film 7 can be high, similar to a case in which the $C_4F_6$ gas is used, by performing dry etching using such etching gas according to the embodiment. In this manner, it is possible to form the memory hole M while suitably protecting the side surfaces of the insulating layers 4 and the sacrifice layers 3 in the memory hole M with the protective film 7. Details of such an advantage of the embodiment will be described later.

Next, the protective film 7 and the mask layer 6 are removed, and a block insulating film 11, a charge storage layer 12, and a tunnel insulating film 13 are formed in this order in the memory hole M (FIG. 1C). Next, the block insulating film 11, the charge storage layer 12, and the tunnel insulating film 13 are removed from the bottom of the memory hole M, and a channel semiconductor layer 14 and a core insulating film 15 are formed in this order in the memory hole M (FIG. 1C). The charge storage layer 12 is a silicon nitride film, for example. The channel semiconductor layer 14 is a polysilicon layer, for example. The block insulating film 11, the tunnel insulating film 13, and the core insulating film 15 are silicon oxide films or metal insulating films, for example.

Thereafter, a plurality of cavities is formed between the insulating layers 4 by removing the sacrifice layers 3, and a plurality of electrode layers are formed in the cavities. Further, a variety of plugs, wirings, interlayer insulating films, and the like are formed on the substrate 1. In this manner, the semiconductor device according to the embodiment is manufactured.

Hereinafter, details of the $C_4F_6$ gas will be described, and details of the etching gas according to the embodiment will be described on the basis of the content.

Figure 2:
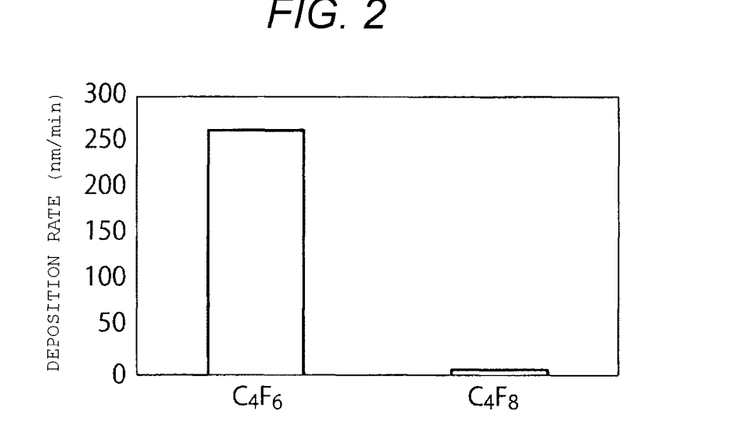
FIG. 2 is a graph for showing $C_4F_6$ gas.

FIG. 2 is a graph for showing the $C_4F_6$ gas.

If $C_4F_6$ (hexafluoro-1,3-butadien) gas is used as etching gas when the insulating layers 4 and the sacrifice layers 3 are etched using the mask layer 6 which is for instance an organic film, a metal film, or a silicon-containing film, a high mask selection ratio is obtained. The $C_4F_6$ gas generating a large amount of protective film 7 is cited as a factor causing such a high selection ratio.

FIG. 2 illustrates the rate of the deposition of the protective film 7 using $C_4F_6$ gas and the rate of the deposition of the protective film 7 using $C_4F_8$ gas. If the $C_4F_6$ gas is used as etching gas, a large amount of protective film 7 will be produced because the rate of deposition of the protective film 7 is high.

Figure 3:
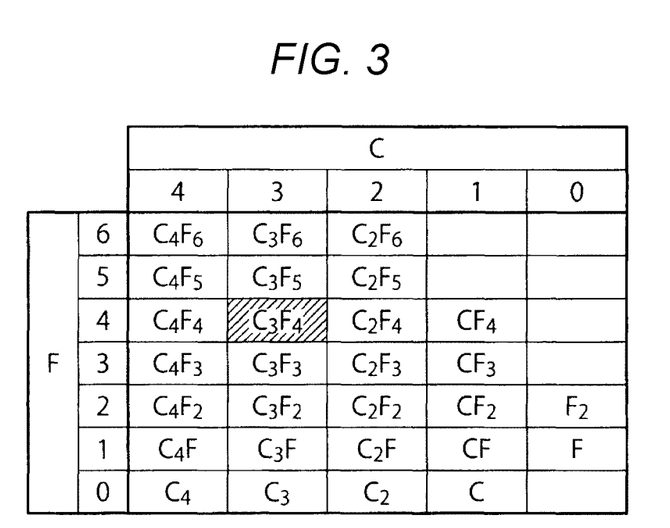
FIG. 3 is a table for showing $C_4F_6$ gas.

FIG. 3 is a table for showing the $C_4F_6$ gas.

In a case where the $C_4F_6$ gas is used as etching gas, the insulating layers 4 and the sacrifice layers 3 are etched using plasma generated from a $C_4F_6$ molecule. Specifically, the protective film 7 is formed by deposition of radicals that are contained in the plasma and contribute to the depositing, and side surfaces of the insulating layers 4 and the sacrifice layers 3 are etched with the radicals and ions that are contained in the plasma and contribute to the etching.

FIG. 3 illustrates 28 types of radicals generated from the $C_4F_6$ molecule. Which of these radicals contributes to the depositing of the protective film 7 will be described with reference to FIG. 4.

Figure 4:
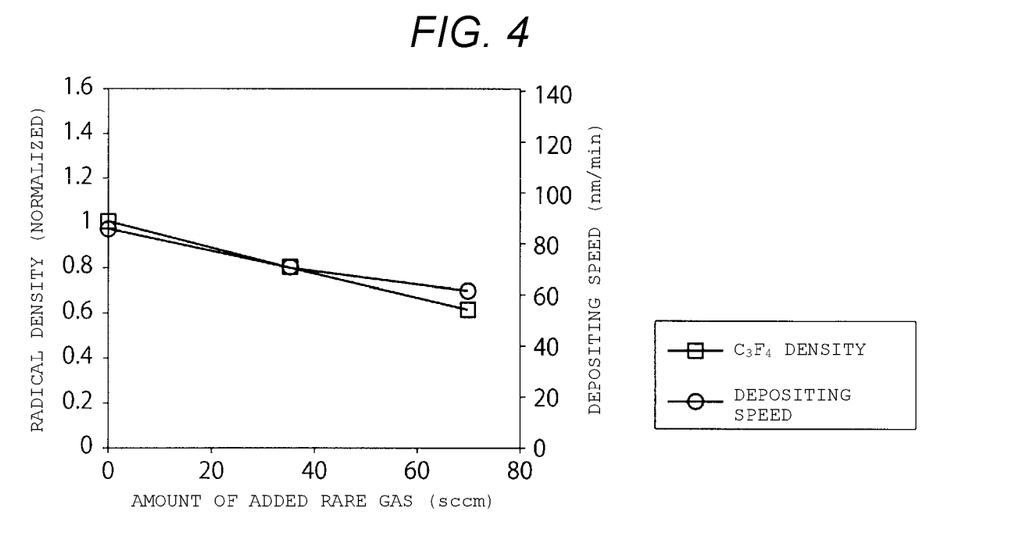
FIG. 4 is another graph for showing $C_4F_6$ gas.

FIG. 4 is another graph for showing the $C_4F_6$ gas.

FIG. 4 illustrates the density of $C_3F_4$ radicals and the rate of deposition of the protective film 7 with different amounts of rare gas added to the etching gas. The density of $C_3F_4$ radicals is normalized with reference to the density in the case where the amount of added rare gas is zero.

Here, the $C_4F_6$ molecule has a structure of $CF_2$=CF—CF=$CF_2$. It is suggested that $C_3F_4$ radicals and $CF_2$ radicals may be easily produced from the $C_4F_6$ molecule because the double bond between $CF_2$ and CF is relatively weak. Thus, examination of the relationship between the density of the $C_3F_4$ radicals and the rate of deposition of the protective film 7 has revealed that there is a correlation between the density of the $C_3F_4$ radicals and the rate of deposition of the protective film 7 (FIG. 4). It is suggested from the result of the examination that the $C_3F_4$ radicals may contribute to the deposition of the protective film 7.

Figure 5A:
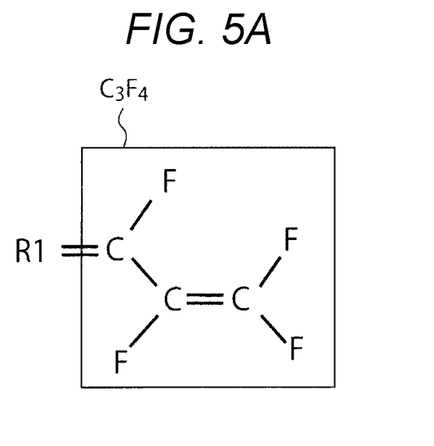
FIGS. 5A and 5B are diagrams for showing constituents of etching gas according to the first embodiment.
Figure 5B:
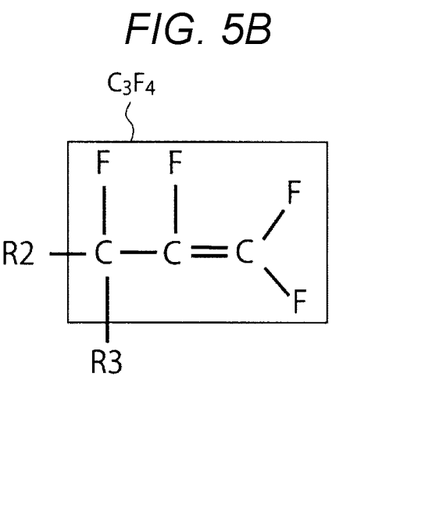

FIG. 5 is a diagram for showing constituents of etching gas according to the first embodiment. The etching gas according to the embodiment contains a first or second molecule as the molecule of carbon and fluorine-containing gas.

FIG. 5A illustrates a structural formula of the first molecule. The first molecule has a $C_3F_4$ group and an R1 group that bonds to a carbon atom in the $C_3F_4$ group through a double bond. The total number of carbon atoms in the first molecule is four or five. The R1 group contains carbon and also chlorine, bromine, iodine, or oxygen. The R1 group may further contain hydrogen or fluorine.

FIG. 5B illustrates a structural formula of the second molecule. The second molecule has a $C_3F_4$ group, an R2 group that bonds to a carbon atom in the $C_3F_4$ group through a single bond, and an R3 group that bonds to the carbon atom in the $C_3F_4$ group through a single bond. The total number of carbon atoms in the second molecule is four or five. The R2 group or the R3 group or both contains carbon, and both the R2 group and the R3 group contain hydrogen, fluorine, chlorine, bromine, iodine, or oxygen.

The insulating layers 4 and the sacrifice layers 3 according to the embodiment are etched using the plasma generated from the first or second molecule in the process illustrated in FIG. 1B. Specifically, the protective film 7 is formed by deposition of the radicals that are contained in the plasma and contribute to the depositing, and the side surfaces of the insulating layers 4 and the sacrifice layers 3 are etched with the radicals and the ions that are contained in the plasma and contribute to the etching. The electron density of the plasma at this time ranges from $5.0\times10^9$ to $2.0\times10^{11}/cm^3$, for example.

Both the first molecule and the second molecule have $C_3F_4$ groups. Therefore, if the plasma is generated from the first or second molecule, it is possible to generate plasma containing $C_3F_4$ radicals similarly to a case in which the plasma is generated from the $C_4F_6$ molecule. According to the embodiment, it is possible to increase the rate of deposition of the protective film 7 and to achieve a high mask selection ratio with the $C_3F_4$ radicals generated from the first or second molecules. In other words, the embodiment allows the first or second molecule to provide suitable carbon and fluorine-containing gas capable of serving as an alternative to $C_4F_6$ gas.

The etching gas according to the embodiment may be mixture gas that contains the first or second molecule and other molecules or may be mixture gas that contains two or more types of first molecules, two or more types of second molecules, or both the first molecule and the second molecule. For example, the etching gas according to the embodiment may contain an oxygen molecule, a rare gas molecule (single atom molecule) or a $C_aF_b$ (fluorocarbon) molecule in addition to the first or second molecule. Here, a and b represent integers that are equal to or greater than one. In some embodiments, a and b each equals to 1.

The total number of carbon atoms in the first molecule according to the embodiment is set to four or five as described above. This is because influences of radicals other than the $C_3F_4$ radicals generated from the first molecule increases, and there may be a probability that etching properties are degraded, if the total number of the carbon atoms in the first molecule is equal to or greater than six. The total number of carbon atoms in the second molecule according to the embodiment is also set to four or five for a similar reason.

It is desirable that the F/C ratio of fluorine atoms and carbon atoms in the R1 group and the F/C ratio of fluorine atoms and carbon atoms in the R2 and R3 groups are set to be equal to or less than two. The F/C ratio in the R1 group is a value obtained by dividing the number of F atoms in the R1 group by the number of C atoms in the R1 group. In a case where the number of C atoms in the R1 group is two, for example, it is desirable that the number of F atoms in the R1 group is set to be equal to or less than four (it may be set to zero). Similarly, the F/C ratio of the R2 and R3 groups is a value obtained by dividing the sum of the F atoms in the R2 group and the F atoms in the R3 group by the sum of the C atoms in the R2 group and the C atoms in the R3 group. The reason for this specification is that the mask selection ratio decreases if these F/C ratios become greater than two.

FIGS. 6 to 9 are diagrams for showing examples of constituents of the etching gas according to the first embodiment.

Figure 6:
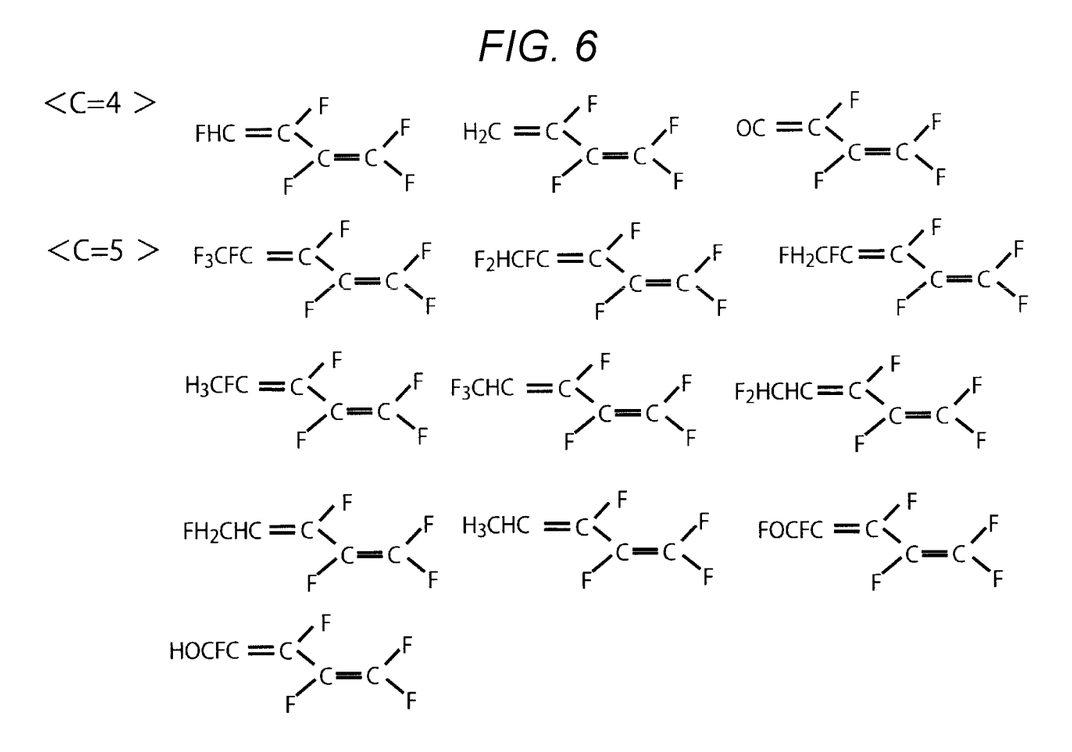
FIG. 6 is a diagram (1/4) for showing examples of constituents of the etching gas according to the first embodiment.

FIG. 6 is a diagram for showing examples of the first molecule and illustrates various structural formulae of various molecules. The first molecule according to the embodiment is obtained by at least partially substituting H atoms and F atoms in each molecule illustrated in FIG. 6 with Cl atoms, Br atoms, or I atoms. The F atoms to be substituted with Cl atoms, Br atoms, or I atoms should be in a group other than the $C_3F_4$ group.

Figure 7:
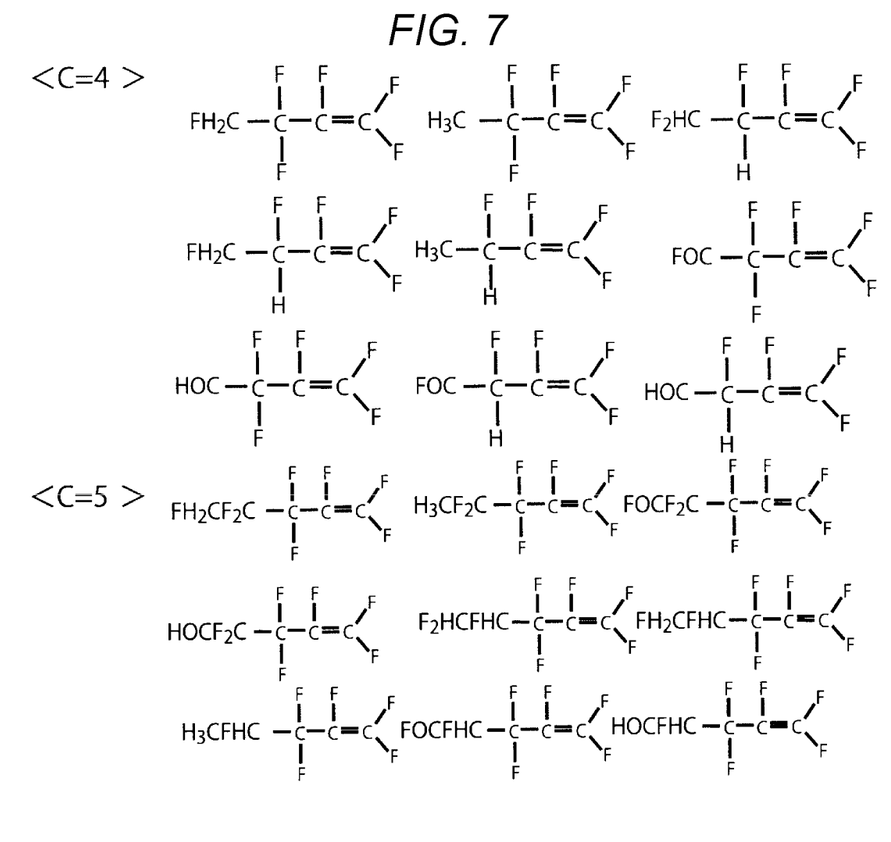
FIG. 7 is a diagram (2/4) for showing examples of constituents of the etching gas according to the first embodiment.
Figure 8:
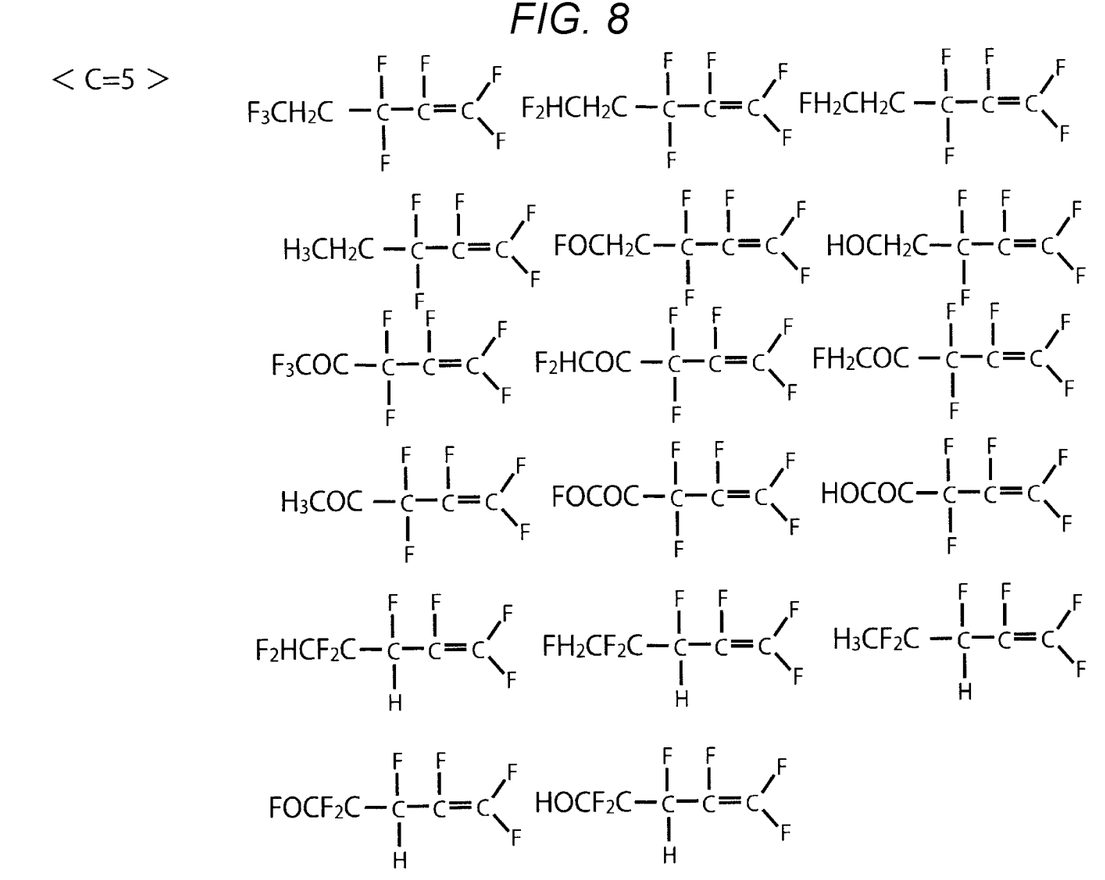
FIG. 8 is a diagram (3/4) for showing examples of constituents of the etching gas according to the first embodiment.
Figure 9:
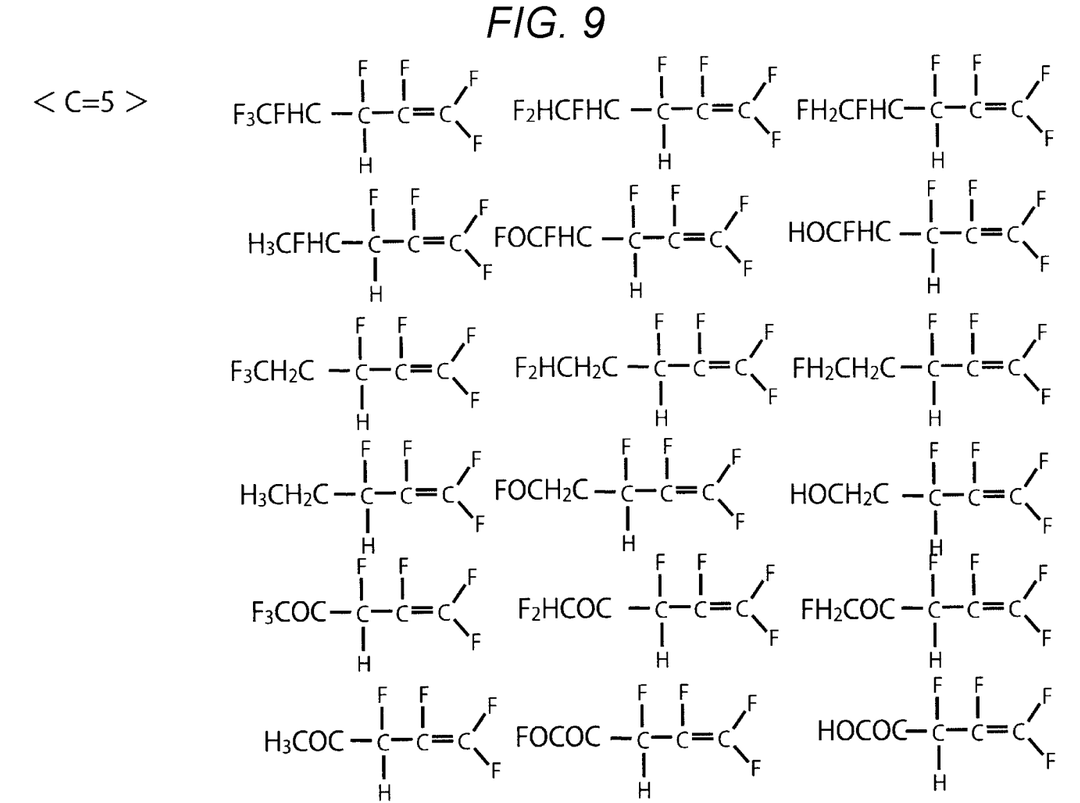
FIG. 9 is a diagram (4/4) for showing examples of constituents of the etching gas according to the first embodiment.

FIGS. 7 to 9 are diagrams for showing examples of the second molecule and illustrates structural formulae of various molecules. FIGS. 7 to 9 illustrate various examples of the second molecule according to the embodiment. Further, the second molecule according to the embodiment is obtained by at least partially substituting H atoms or F atoms in each molecule illustrated in FIGS. 7 to 9 with Cl atoms, Br atoms, or I atoms. The F atoms to be substituted with Cl atoms, Br atoms, or I atoms should be in a group other than the $C_3F_4$ group.

The first and second molecules according to the embodiment are not limited to these molecules and may have other compositions and structures.

Figure 10:
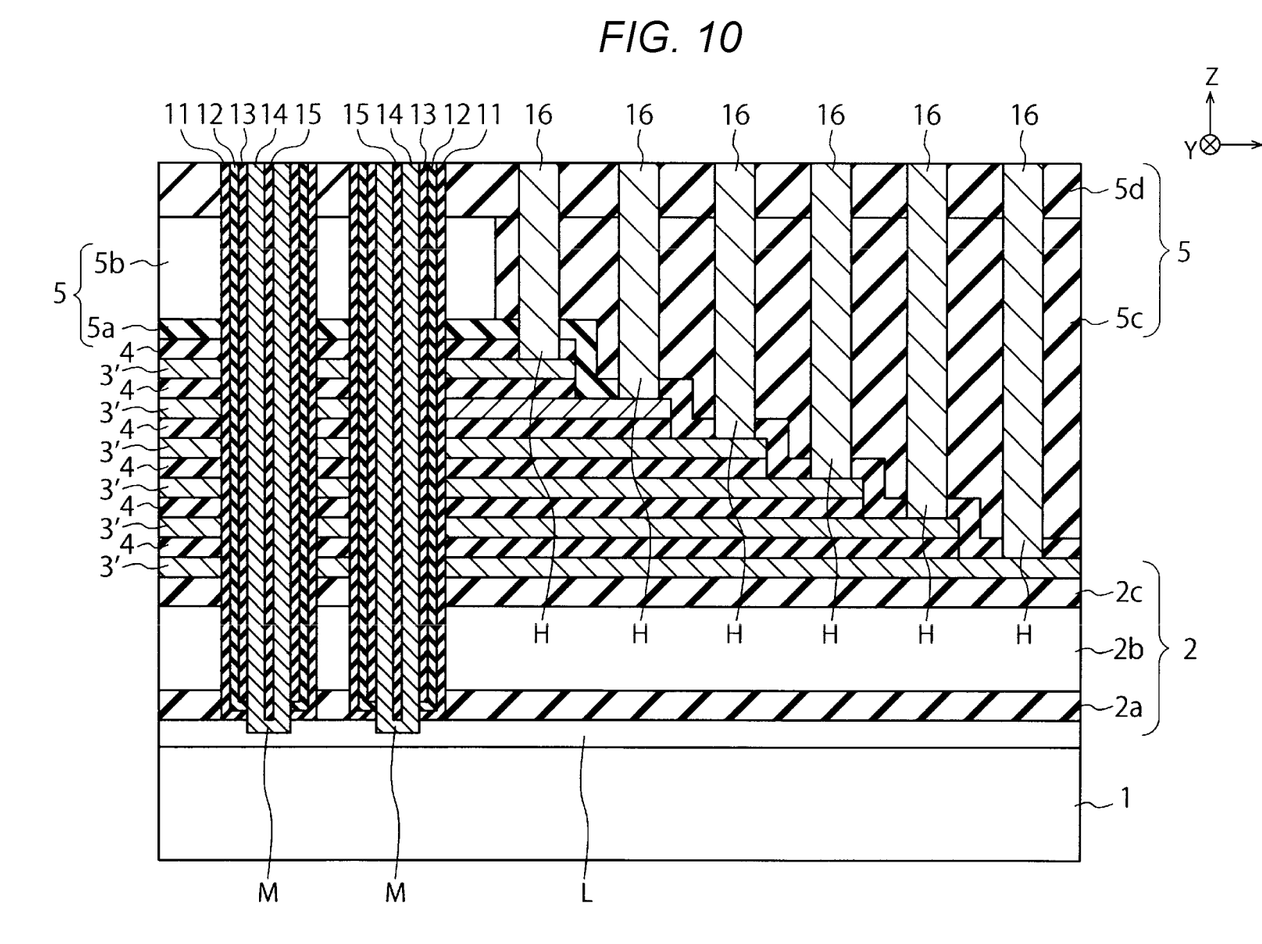
FIG. 10 is a sectional view illustrating a structure of the semiconductor device according to the first embodiment.

FIG. 10 is a sectional view illustrating a structure of a semiconductor device according to the first embodiment.

FIG. 10 illustrates an example of a semiconductor device manufactured by a method according to the embodiment. FIG. 10 illustrates a memory cell unit of a three-dimensional memory and a staircase contact unit. In FIG. 10, the lower layer 2 is configured with a first insulating film 2a, a source-side conductive layer 2b, and a second insulating film 2c while the upper layer 5 is configured with a cover insulating film 5a, a drain-side conductive layer 5b, a first interlayer insulating film 5c, and a second interlayer insulating film 5d. The channel semiconductor layer 14 is electrically connected to a diffusion layer L in the substrate 1. The sacrifice layers 3 are replaced with electrode layers 3' that contain tungsten (W) layers and the like. The electrode layers 3' are an example of the first film.

FIG. 10 further illustrates contact plugs 16 that are formed in contact holes H in the upper layer 5. The respective contact plugs 16 are formed such that they are electrically connected to the corresponding electrode layers 3'.

As described above, the memory hole M according to the embodiment is formed using the etching gas that contains the first or second molecule that has the $C_3F_4$ group. Therefore, according to the embodiment, it is possible to etch the insulating layers 4 and the sacrifice layers 3 with the suitable carbon and fluorine-containing gas. For example, it is possible to execute suitable etching similarly to the $C_4F_6$ gas without using the $C_4F_6$ gas of an expensive unit price. According to the embodiment, it is also possible to form the memory hole M into a suitable shape, for example one that has a high aspect ratio of equal to or greater than 10.

The plurality of electrode layers 3' and the plurality of insulating layers 4 may be alternately formed on the lower layer 2 instead of alternately forming the plurality of sacrifice layers 3 and the plurality of insulating layers 4 on the lower layer 2 in the process illustrated in FIG. 1A. In this case, the process of replacing the sacrifice layers 3 with the electrode layers 3' is not needed.

In addition, the dry etching according to the embodiment may also be used for processes other than the process of forming the memory hole M, and may be used for a process of forming a recess portion other than the memory hole M, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
   etching a film using etching gas that has a first molecule or second molecule, the etching gas having a $C_3F_4$ group, the etching gas having a number of carbon atoms of four or five,
   the first molecule represented by a general formula (1) described below, where R1 group contains carbon and at least one of chlorine, bromine, iodine, or oxygen, (1)

and
the second molecule represented by a general formula (2) described below, where R2 group and R3 group each contains at least one of hydrogen, fluorine, chlorine, bromine, iodine, or oxygen (2)

2. The method according to claim 1, wherein an F/C ratio of fluorine atoms and carbon atoms in the R1 group or an F/C ratio of fluorine atoms and carbon atoms in the R2 or R3 group is equal to or less than two.

3. The method according to claim 1, wherein the film includes a plurality of first films and a plurality of second films that are alternately formed on a substrate.

4. The method according to claim 1, wherein a recess portion with an aspect ratio equal to or greater than ten is formed in the film through the etching.

5. The method according to claim 1, wherein the etching gas further contains at least an oxygen molecule, a rare gas molecule, or a $C_aF_b$ molecule, wherein a and b represent integers that are equal to or greater than one.

6. The method according to claim 1, wherein etching the film comprises etching with plasma generated from the first or second molecule.

7. The method according to claim 6, wherein the plasma contains $C_3F_4$ radicals that are generated from the first or second molecule.

8. The method according to claim 7, wherein an electron density of the plasma ranges from $5.0\times10^9$ to $2.0\times10^{11}$/cm$^3$.

9. An etching gas comprising:
   a first molecule, which has a $C_3F_4$ group, in which a number of carbon atoms is four or five,
   the first molecule represented by a general formula (1) described below, where R1 group contains carbon and further contains chlorine, bromine, iodine, or oxygen (1)

10. The etching gas according to claim 9, wherein an F/C ratio of fluorine atoms and carbon atoms in the R1 group or an F/C ratio of fluorine atoms and carbon atoms in the R2 or R3 group is equal to or less than two.

11. The etching gas according to claim 9, further comprising a single atom molecule.

12. The etching gas according to claim 9, wherein the number of carbon atoms is five.

13. The etching gas according to claim 9, further comprising at least an oxygen molecule, a rare gas molecule, or a $C_aF_b$ molecule, wherein a and b represent integers that are equal to or greater than one.

14. The etching gas according to claim 13, wherein a and b are each equal to 1.

15. An etching gas comprising:
   a second molecule, which has a $C_3F_4$ group, in which a number of carbon atoms is four or five,
   the second molecule represented by a general formula (2) described below, where R2 group and R3 group each contain at least one of hydrogen, fluorine, chlorine, bromine, iodine, or oxygen (2)

16. The etching gas according to claim 15, further comprising at least an oxygen molecule, a rare gas molecule, or a $C_aF_b$ molecule, wherein a and b represent integers that are equal to or greater than one.

17. The etching gas according to claim 15, wherein an F/C ratio of fluorine atoms and carbon atoms in the R1 group or an F/C ratio of fluorine atoms and carbon atoms in the R2 or R3 group is equal to or less than two.

18. The etching gas according to claim 15, further comprising a single atom molecule.

19. The etching gas according to claim 15, wherein a and b are each equal to 1.

20. The etching gas according to claim 15, wherein the number of carbon atoms is five.

* * * * *